United States Patent [19]

Sequin

[11] 3,934,261

[45] Jan. 20, 1976

[54] TWO-DIMENSIONAL TRANSFER IN CHARGE TRANSFER DEVICES

[75] Inventor: Carlo Heinrich Sequin, New Providence, N.J.

[73] Assignee: Bell Telephone Laboratories, Incorporated, Murray Hill, N.J.

[22] Filed: Feb. 13, 1975

[21] Appl. No.: 549,759

Related U.S. Application Data

[63] Continuation of Ser. No. 357,590, May 7, 1973, abandoned.

[52] U.S. Cl. .................................................. 357/24
[51] Int. Cl.² ......................................... H01L 29/78
[58] Field of Search ....................................... 357/24

[56] References Cited
UNITED STATES PATENTS

3,777,186  12/1973  Chang................................. 357/24

*Primary Examiner*—Stanley D. Miller, Jr.
*Assistant Examiner*—E. Wojciechowicz
*Attorney, Agent, or Firm*—L. H. Birnbaum

[57] ABSTRACT

Charge transfer devices of either the charge coupled or bucket brigade type are described which allow movement of charge carriers in two noncollinear directions in the surface plane of the device. One level of metallization is utilized to provide the appropriate surface potential for charge transfer in the storage medium.

The electrode pattern comprises charge transfer electrodes which are coupled diagonally to one of a plurality of conduction paths. Directionally is aided by asymmetric potentials under each electrode which may be formed by localized regions of fixed charge at the surface of the storage medium. Horizontal or vertical transfer is determined by the sequence of biasing the conductive paths. In one embodiment, the electrode pattern is formed by strips of conductive material shaped in the form of diagonally overlapping quadrilateral members and positioned so as to form an array resembling the normal two-dimensional array of discrete transfer electrodes.

7 Claims, 12 Drawing Figures

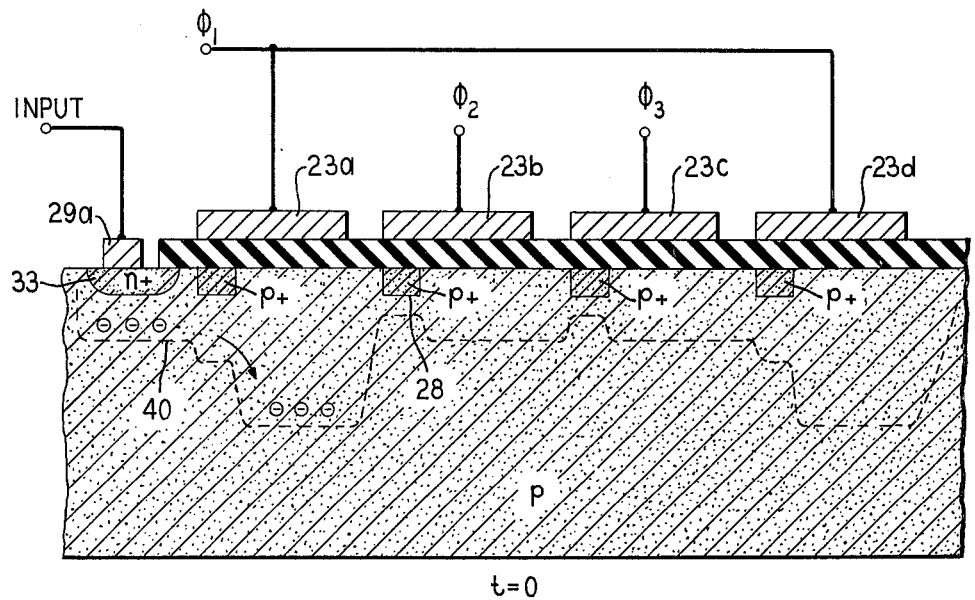
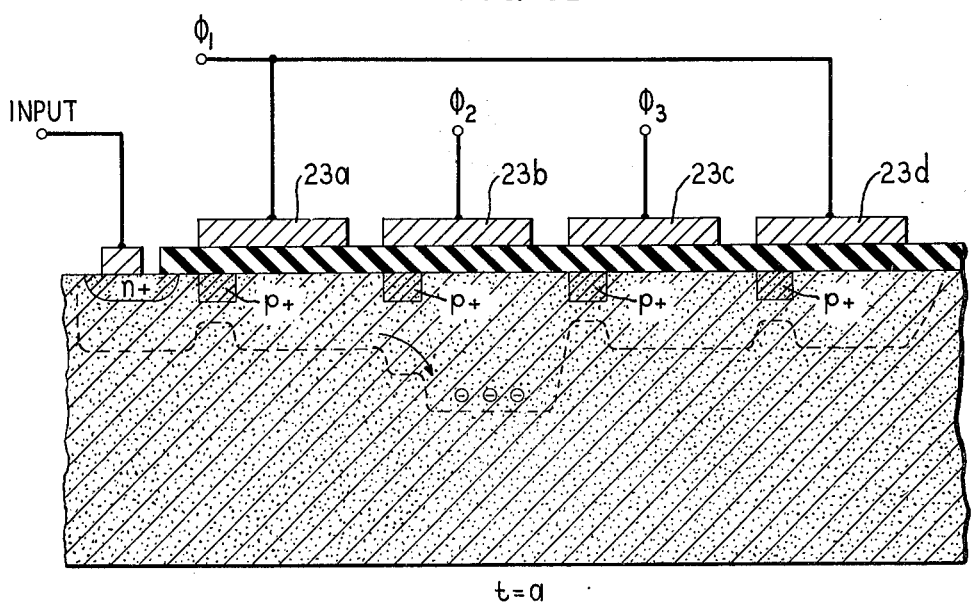

TWO-DIMENSIONAL TRANSFER IN CHARGE TRANSFER DEVICES

CROSS-REFERENCE TO RELATED APPLICATION

This application is a continuation of my copending application Ser. No. 357,590 filed May 7, 1973 assigned to the present assignee, now abandoned.

BACKGROUND OF THE INVENTION

This invention relates to charge transfer devices and in particular to devices in which charge carriers may be transferred in two noncollinear directions.

"Charge Transfer Device" (CTD) has come to be known as the generic description for devices which store and transfer charge carriers in a storage medium by means of appropriate potentials created at or near the surface of the medium by a series of electrodes disposed upon an insulating layer overlying the surface of the medium. These devices may be of the charge coupled (CCD) or bucket brigade (BBD) type. In the basic bucket brigade device, regions of fixed charge are provided in the storage medium beneath each electrode and extending slightly into the area below an adjacent electrode in the charge transfer path. When an electrode is biased, the region of charge immediately under it is reversed biased and the channel between this region and its neighbor is inverted to permit the transfer of charge. Thus, mobile charge carriers are stored in fixed charge regions as majority carriers and transferred through the channels as minority carriers. The basic charge coupled device stores charge carriers under depletion biased electrodes and transfers the charge carriers by creating a succession of potential wells at the storage medium surface along the transfer path. Charge is therefore stored and transferred in the form of discrete packets of minority carriers in the medium.

Most prior art devices have proposed electrode configurations for moving charge carriers in essentially a linear path, including schemes for moving charge in serpentine fashion and for reversing the transfer to the opposite direction. In many information processing applications, such as time division multiplexing, it is necessary to provide for conversion from serial-to-parallel and parallel-to-serial transfer of charge as well as many other types of logic operations. Thus one can make advantageous use of a device which is capable of transferring charge from any particular storage location in either of two noncollinear directions.

In order to meet this need, a device was proposed which utilized an electrode network in two levels of metallization to define noncollinear transfer paths in the medium. (See U.S. patent application of R. H. Krambeck-C. H. Sequin-R. H. Walden, Ser. No. 342,173, filed Mar. 16, 1973 and assigned to the present assignee.) In some cases, two levels of metallization may present some fabrication difficulties. Hence, it is desirable to provide an alternative structure which needs only one level of metallization in order to transfer charge in two noncollinear directions.

SUMMARY OF THE INVENTION

In accordance with the invention, transfer electrodes in a diagonal direction in the two-dimensional array are coupled in common to one of a plurality of conduction paths. An appropriate pulsing sequence applied to the conduction paths moves the charge in either a horizontal or vertical direction. Reverse transfer in either the horizontal or vertical direction is prevented by means of an asymmetric potential created under each electrode, preferably by localized regions of fixed charge at the storage medium surface. In one embodiment, the electrode pattern is formed by strips of conductive material shaped in the form of quadrilateral members overlapping in their diagonal dimension and positioned so as to form the required transfer paths in two noncollinear directions.

BRIEF DESCRIPTION OF THE DRAWING

These and other features of the invention will be delineated in detail in the description to follow. In the drawing:

FIGS. 3A–3D are cross-sectional views along line 3—3 of FIG. 2 illustrating movement of charge in one direction in the device of FIG. 2;

DETAILED DESCRIPTION OF THE INVENTION

Figure 1:
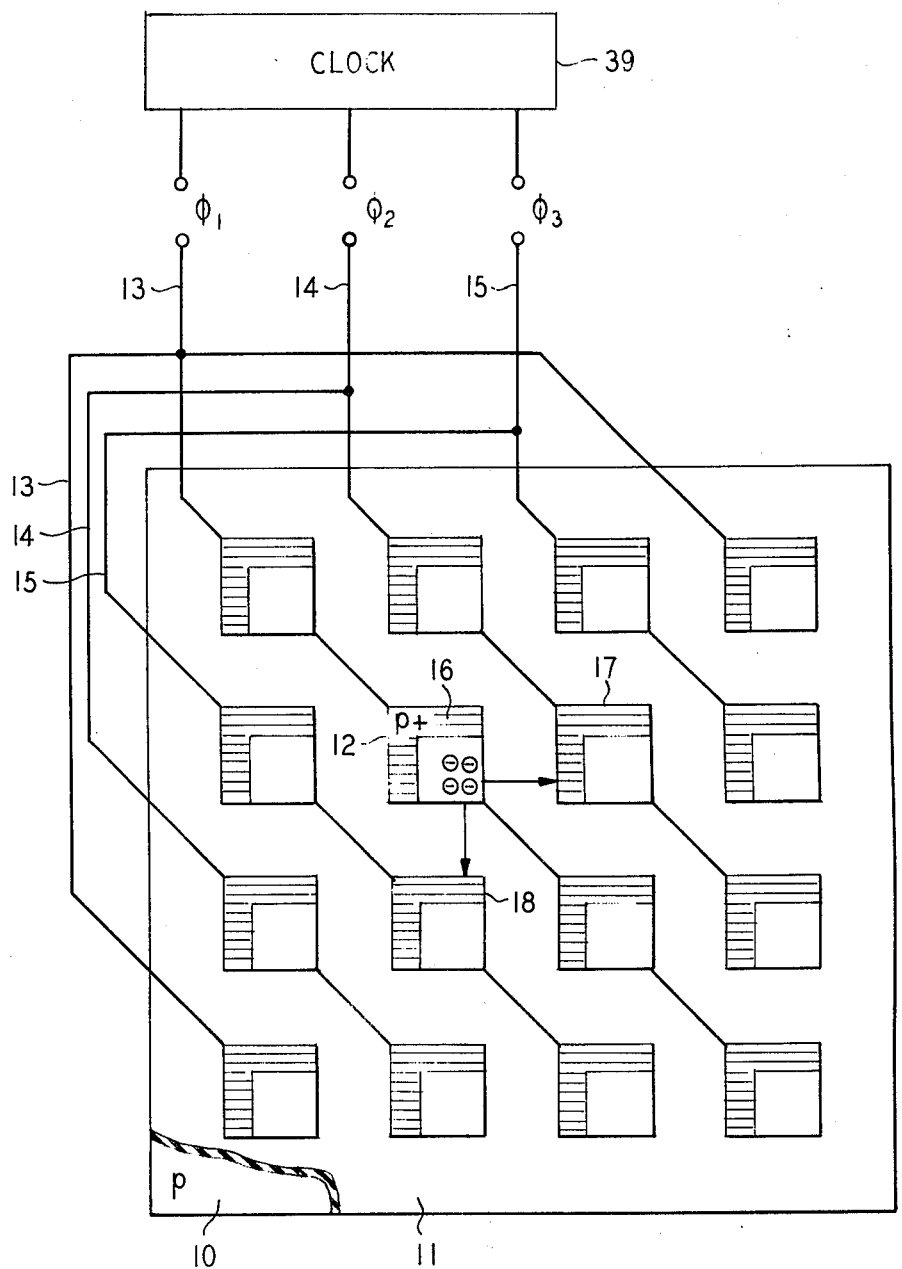
FIG. 1 is a schematic plan view of a charge coupled device in accordance with one embodiment of the present invention.

The basic concept of the present invention can be most easily seen from the schematic illustration of FIG. 1. There is shown here a simple charge coupled device comprising a semiconductor storage medium 10, illustratively p-type silicon, an insulating layer 11, typically SiO$_2$, overlying the medium, and a 4×4 array of electrodes such as 12 disposed upon the insulating layer. According to one feature of the invention, the area of the storage medium under each electrode (i.e., the storage site), is adapted so that mobile charge carriers, in this case electrons, may enter from either one of two directions and exit in either one of two directions. This is accomplished by providing an asymmetric potential well under each electrode when properly biased. In this embodiment, the asymmetric potential well is established by regions of fixed charge such as 16 with the same conductivity type as the semiconductor (in this case p+) positioned at the surface of the storage medium under each electrode. Ion implantation may be used to form such regions. It will be noted that these fixed charge regions completely bound two sides of each electrode while leaving a path open on the two other sides for transfer of the carriers out of the storage sites. Since charge moves only to the right or downward in the array as shown, the fixed charge regions may be thought of as being located at the "back" edge of each electrode in the horizontal and vertical transfer paths. (The fixed charge regions, although located in the storage medium and therefore not visible in a plan view, are shown for purposes of illustration as the shaped regions under each electrode.) In accordance with another feature of the invention, the electrodes are coupled together in a diagonal direction to individual ones of conduction paths 13, 14, or 15 to which pulse trains $\Phi_1$, $\Phi_2$, and $\Phi_3$, respectively, are supplied by some clock means 39. This diagonal coupling permits a choice of transferring carriers from any storage site in either a horizontal or vertical direction. For example, assume minority charge carriers represented by "θ" in FIG. 1 reside in the storage site under electrode 12 as illustrated and that conductor 13 has a pulse potential applied thereto which is greater than the rest potentials applied to conductors 14 and 15. If conductor 14 is now pulsed, while conductor 13 is lowered to a rest potential, the minority carriers will transfer into the area under the adjacent horizontal electrode 17. The carriers are prevented from moving in any other direction due to the potential barrier created by the fixed charge regions under the other electrodes held at rest potential. Similarly, if conductor 15 were pulsed, the carriers would move in a vertical direction to beneath electrode 18. It should be clear that a precisely equivalent structure would have fixed charge regions of conductivity opposite to the substrate (n+) in the areas under electrodes shown undoped in FIG. 1 (i.e., the front edge of each electrode in the transfer path) rather than the regions of p+ conductivity type. The asymmetry in the potential wells would therefore be created by fixed charge regions which would be more attractive to minority carriers than the undoped portions, instead of by the repulsive regions of FIG. 1. It should also be clear that by providing the proper fixed charge regions in the storage medium, bucket brigade devices may be constructed in accordance with the principles of the invention. Such adaption of the principles described herein would be obvious to those skilled in the art and consequently a detailed discussion of bucket brigade devices is omitted for the sake of brevity. It will also be apparent that the asymmetric potential wells may be formed by disposing the electrodes on a nonuniform insulating layer as is known in the art (i.e., with the back edge of each electrode overlying a thicker portion of the insulator that the front edge). Furthermore, it will be realized that an n-type storage medium may be used in the device, in which case all polarities described would be reversed.

The foregoing discussion is meant to give a brief picture of the basic concepts of the present invention. A more detailed discussion of the actual construction of a device in accordance with the invention is presented below in reference to the embodiment shown in FIG. 2.

Figure 2:
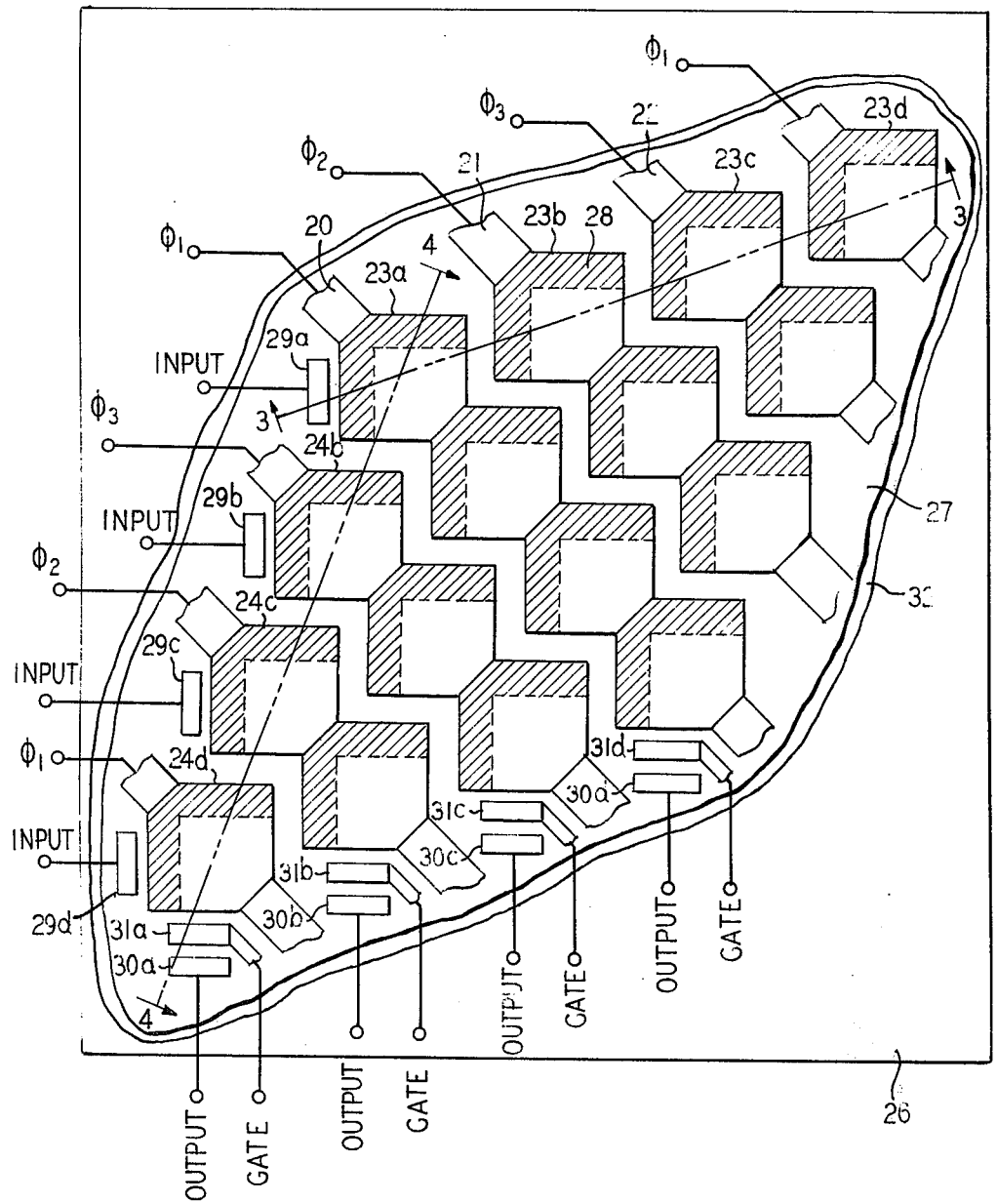
FIG. 2 is a plan view, partly schematic, of a portion of a charge coupled device in accordance with a further embodiment of the invention.

In FIG. 2 there is shown a portion of a charge coupled device, partly cut away, employing the inventive principles previously discussed. Again, the device comprises a charge storage medium 26 such as silicon, an insulating layer 27 such as SiO$_2$ overlying a major surface of the medium, and an array of electrodes disposed upon the insulating layer for storage and transfer of charge carriers in the medium. In this embodiment, however, the electrodes are formed by a series of conductive strips, such as 20, 21 and 22, overlying the charge transfer area, each shaped in the form of a series of diagonally overlapping quadrilateral members which in this case are squares. The strips are positioned to form essentially a 4×4 array of transfer electrodes, one row of which consists of electrodes 23a–d and one column of which consists of electrodes 23a and 24b–d. It will be appreciated that this electrode configuration is a practical equivalent of the scheme illustrated in FIG. 1. As before, regions of fixed charge, such as 28 of the same conductivity type as the storage medium, are provided in the medium beneath the back edge of each electrode to prevent reverse transfer of charge carriers in either the horizontal or vertical directions. (Although not visible in a plan view, the fixed charge regions are illustrated as shaded regions in this figure for the sake of clarity in understanding the structure.) It will be appreciated that this simple array is presented for purposes of description, and in actual practice a charge coupled device would comprise many more electrodes.

In this particular embodiment, a mass serial-to-parallel conversion operation will be described. Thus, input electrodes 29a–29d are provided adjacent to the first electrodes in each row of the array and output electrodes 30a–30d along with gate electrodes 31a–31d are provided adjacent to the last electrodes in each column of the array. It will be clear that many other logic operations are possible in accordance with the invention and therefore the particular operation described here should be considered illustrative only.

The charge transfer region of the storage medium is bounded by a strip of fixed charge 32 of the same conductivity type as the medium as shown in the cut-away portion of FIG. 2. This region of charge is better known as a "channel stopping" or "chanstop" region. Pulse trains $\Phi_1$, $\Phi_2$ or $\Phi_3$ are applied to each conductive strip as illustrated in order to move mobile charge carriers in the manner desired. The clocking means is not shown in this figure for the sake of clarity in the illustration.

Figure 4A:
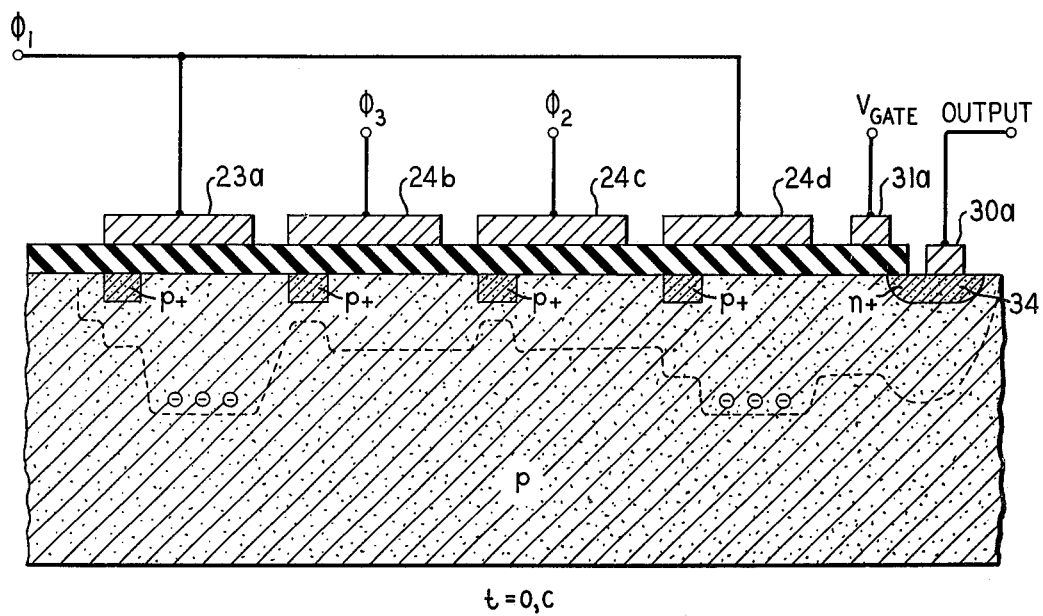
FIGS. 4A–4D are cross-sectional views along line 4—4 of FIG. 2 illustrating movement of charge in another direction in the device of FIG. 2.
Figure 5:
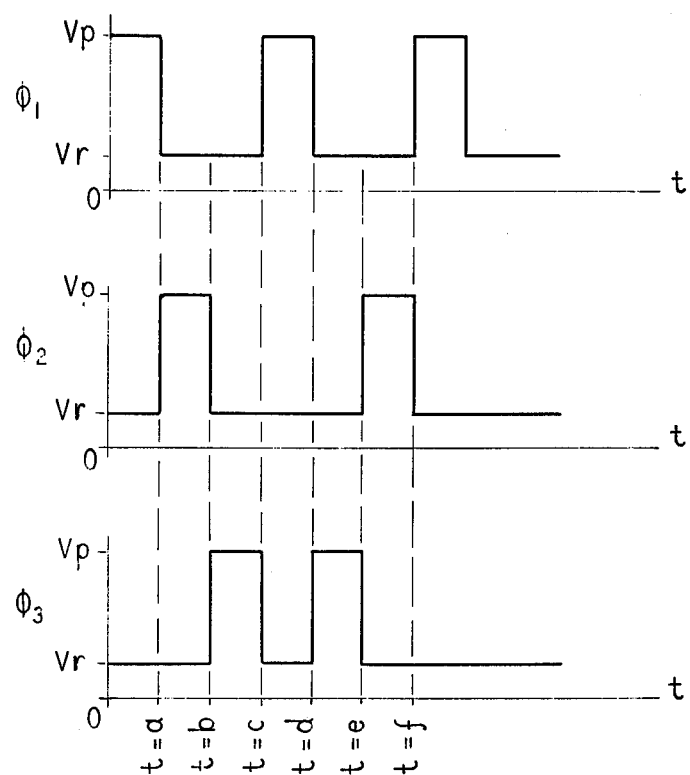
FIG. 5 is a schematic diagram of the pulse train supplied to each conduction path of the device in FIG. 2 in order to move charge in accordance with the same embodiment.

The actual operation of the device is illustrated first in FIGS. 3A–3D which are cross-sectional views along line 3—3 of FIG. 2, in association with FIG. 5 which illustrates the pulse trains supplied to each conductive strip. It will first be noted in FIG. 3A that the input means comprises an electrode 29a, previously mentioned, in association with a localized region of charge 33 of n+ conductivity type for the introduction into the medium of minority carriers represented by "θ" in the figure. The particular means which may be employed for the introduction, as well as the detection, of mobile carriers are varied and well known in the art. The depletion region depth in the medium created by the biased electrodes is represented by the dashed line 40. This in turn is representative of the potential created along the medium-insulator interface. At $t=0$, pulse train $\Phi_1$ applies a potential Vp to electrodes 23a and 23d in the row shown in FIG. 3A. This creates a potential under electrode 23a which is greater than that under the input means and so injected minority carriers are attracted to the area under electrode 23a as shown. By the same mechanism, mobile charge is introduced and transferred to the area under electrode 24d (see FIG. 4A). It will be understood in the succeeding discussion that the transfer of charge shown for the first row of electrodes is equally applicable to the fourth row of electrodes in the array of FIG. 2. Charge remains under the first electrode since electrodes 23b and 23c are biased at a lower potential $V_r$ by pulse trains $\Phi_2$ and $\Phi_3$, respectively, to create a potential barrier to any further transfer.

Figure 3C:
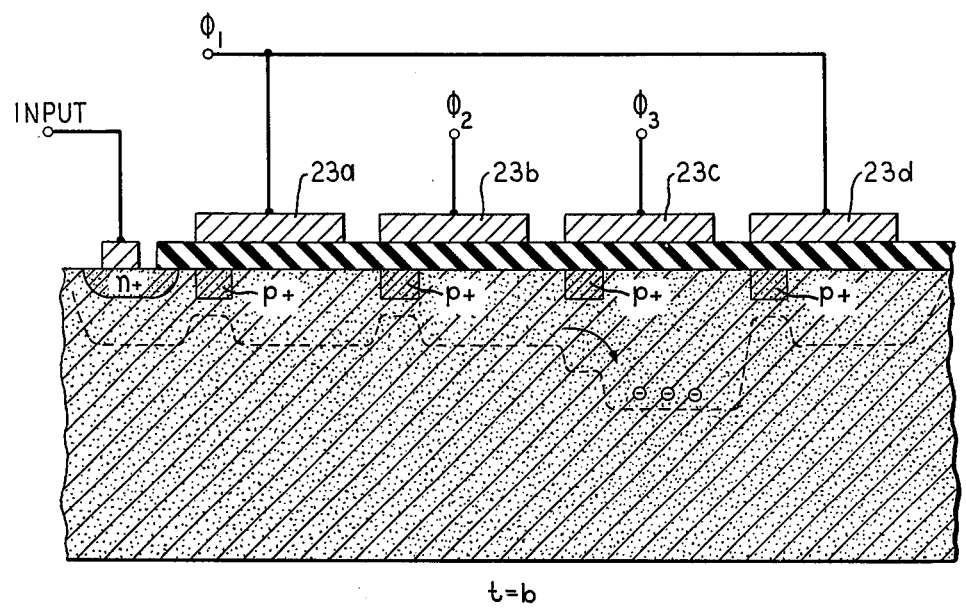
Figure 3D:
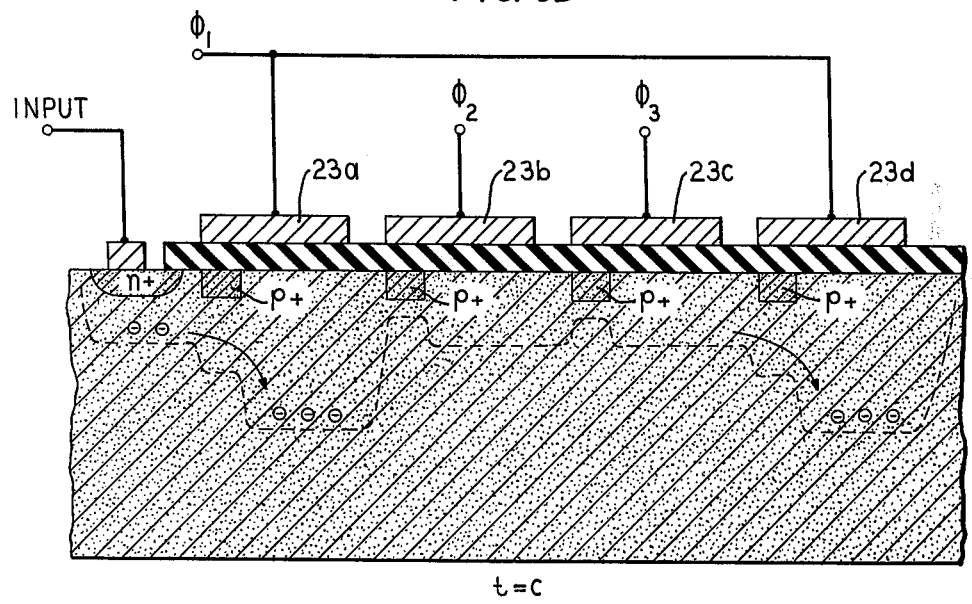

At $t=a$, as shown in FIG. 3B, the charge packet is then transferred to the area under the adjacent electrode in the row (23b) by applying a potential $V_p$ thereto while lowering the potential applied to 23a and 23d to $V_r$ (see FIG. 5). Charge will not move in the vertical direction since the pulse train $\Phi_3$ which is supplied to the adjacent vertical electrode, i.e., 24b, remains at $V_r$, creating a potential barrier to transfer in that direction. It should also be appreciated that charge will never move either up or to the left in FIG. 2 since the asymmetric potential created under each electrode by the p+ regions establishes a continuous barrier to charge transfer in those directions. Transfer of the charge packet down the row continues at $t=b$ by raising the potential from pulse train $\Phi_3$ to $V_p$ and lowering the potential of $\Phi_2$ to $V_r$, as shown in FIG. 3C. Once again, vertical transfer is blocked by the low potential applied to the adjacent vertical electrode (i.e., the potential applied by pulse train $\Phi_1$). Finally, at $t=c$, as shown in FIG. 3D, $\Phi_1$ again supplies a potential $V_p$ to electrodes 23a and 23d so that the charge packet is transferred to the area under electrode 23d while a new charge packet is transferred to the area under electrode 23a.

As a result of this pulsing sequence, charge packets reside in the storage sites under the first and fourth electrodes of the first and fourth rows of the array. In order for the charge information to be read out in parallel, vertical transfer down the first and fourth columns to the respective outputs 30a and 30d is effected. This series of transfers is shown in FIGS. 4A–4D for the first column of the array. FIG. 4A illustrates the position of the charge packets at $t=c$.

Figure 4B:
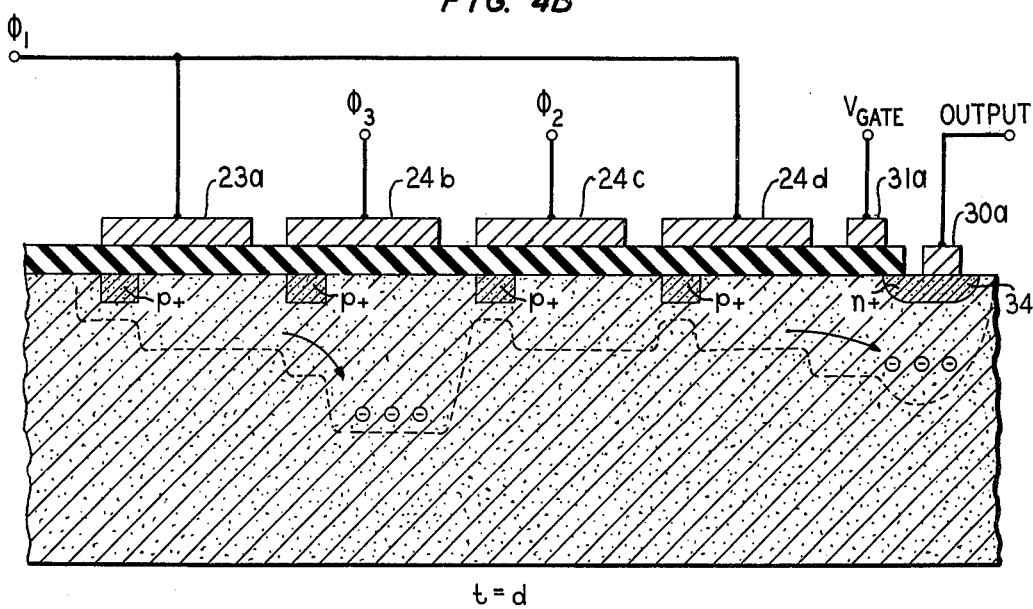
Figure 4C:
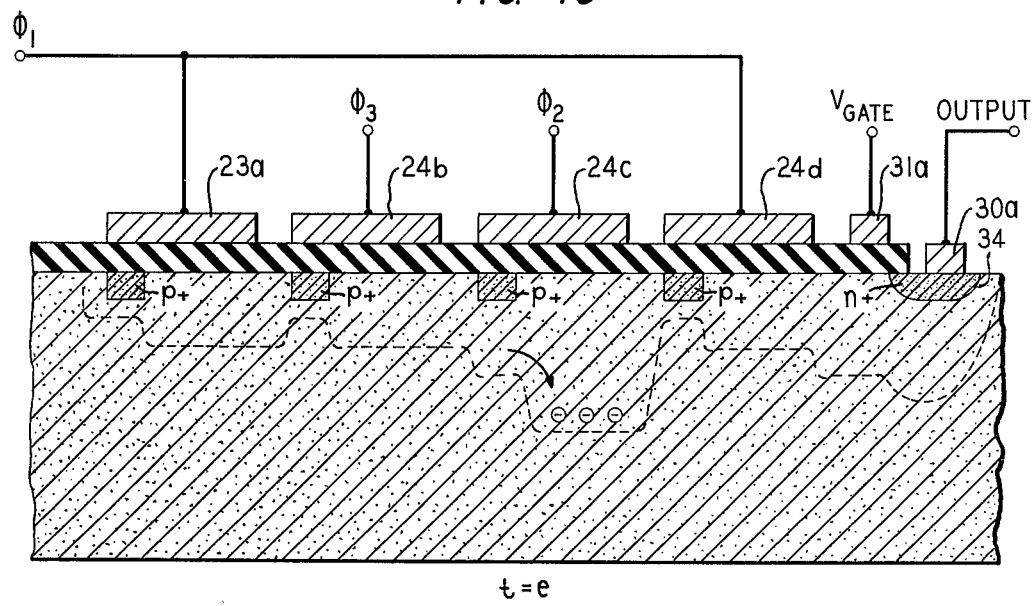
Figure 4D:
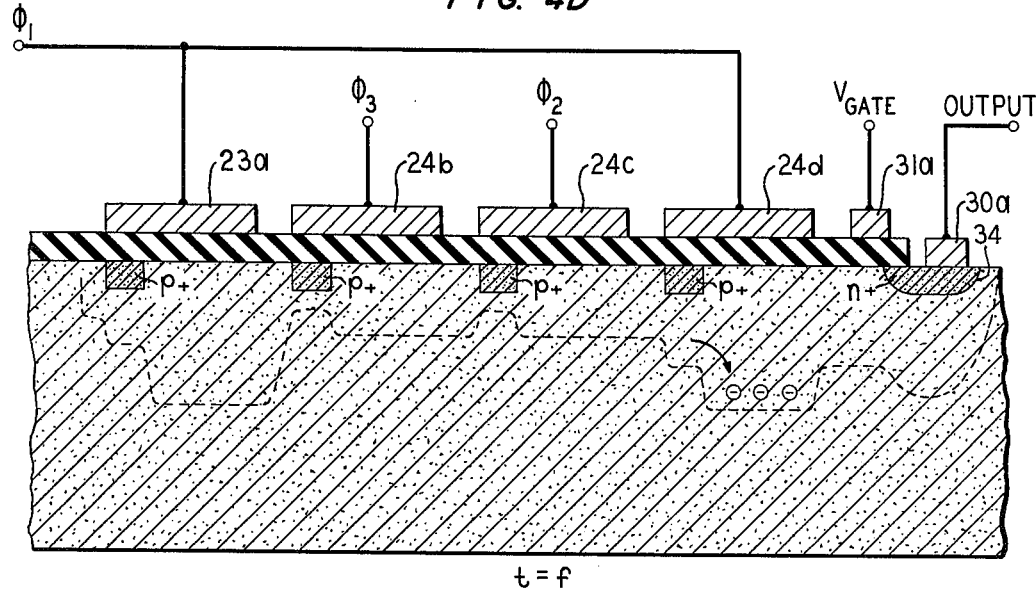

It will be noted that the output means comprises an output electrode 30a in association with a region of n+ conductivity type 34 as in the input means. There is also added a gate electrode 31a over the area between the last electrode in the column (in this figure, 24d) and the n+ region. A potential $V_{gate}$ is supplied to this electrode to establish a potential thereunder which is less than the potential under electrode 24d when in a pulsed on condition but greater than the potential in a pulsed off condition. During horizontal transfer, the gate is biased at a sufficiently low potential to prevent any transfer to the output means. This form of output means is also known in the art and so is not discussed in further detail. At $t=d$, the potential applied to 23a and 24d by $\Phi_1$ is returned to $V_r$, while $\Phi_3$ supplies a potential $V_p$ to electrode 24b. As illustrated in FIG. 4B, this causes the packet of charge residing under 23a to be transferred to under 24b. At the same time, the packet under 24d is transferred to the depletion region formed by the combination of output electrode 30a and localized n+ region 34. This charge packet then appears as a current at the output terminal. Horizontal transfer is prevented because of the barrier created under the adjacent horizontal electrodes by the low potential, $V_r$, supplied by $\Phi_2$. Vertical transfer then proceeds in order to read out the remaining charge packet by sequentially supplying a pulse to electrode 24c by $\Phi_2$ and 24d by $\Phi_1$ at $t=e$ and $t=f$. This sequence is illustrated in FIGS. 4C–4D. The final charge packet is read out by removing the pulse from 24d so the packet is transferred to the output means. Again it will be realized that this pulsing sequence transfers the packets under the fourth column of the array in an identical manner.

It will be appreciated that the pulse train shown in FIG. 5 is used primarily for the purpose of illustration. In actual practice, as is well known in the art, it would be more desirable to provide overlapping sawtooth-type pulses for greater transfer efficiency.

The charge concentration of the localized charge regions 28, as well as the potentials $V_p$ and $V_r$ will depend on many factors such as the impurity concentration of the storage medium, the charge concentration of the insulating layer 27, and the thickness of the insulating layer. A determination of these parameters can be easily made by those skilled in the art according to known calculations. Therefore, a detailed discussion of this matter is omitted. However, the following values are presented as an illustrative embodiment:

Impurity concentration of storage medium (26) = $10^{15}$ cm$^{-3}$;
Thickness of insulator (27) = 1,000 angstroms;
Charge concentration of insulator <$10^{11}$ cm$^{-2}$;
Impurity concentration of localized fixed charge regions (28) = $1.5 \times 10^{12}$ cm$^{-2}$;
$V_p$ = 13 volts;
$V_r$ 3 volts;
Impurity concentration of channel stopping region (32) = $10^{18}$ cm$^{-3}$.

Figure 6:
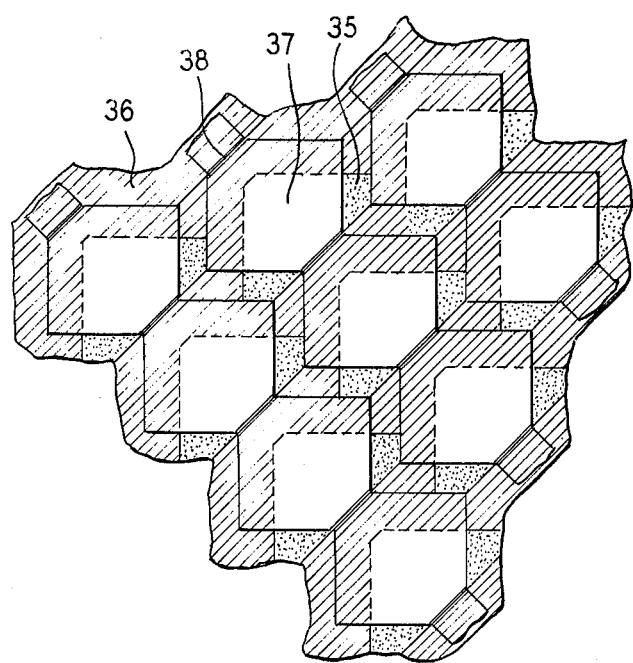
FIG. 6 is a schematic plan view of a portion of a charge coupled device in accordance with a further embodiment of the invention.

Clearly, there are many modifications which may be employed as part of the inventive structure, some of which are illustrated in FIG. 6, which is a schematic plan view of a portion of a CCD in accordance with a further embodiment of the invention. Once again, charge regions in the storage medium are illustrated in this view to show their relative position with respect to the electrode array. In accordance with one feature of this embodiment, transfer efficiency is improved by utilizing the conductively connected CCD principle. This involves placing heavily doped fixed charge regions, shown as stipled regions such as 35 in the figure, of a conductivity type opposite to that of the storage medium in the gaps between electrodes along the charge transfer paths. The use of such regions essentially provides a short circuit across the spaces between electrodes. (For a detailed discussion of this concept, see U.S. patent application of R. H. Krambeck-G. E. Smith-R. J. Strain, Ser. No. 262,787, filed June 14, 1972 and assigned to the present assignee.) In the illustrative embodiment presented above, therefore, an n-type region of concentration $10^{14}$ cm$^{-2}$ could be introduced into the gaps between electrodes along both the horizontal and vertical transfer paths. Furthermore, since such fixed charge regions would compensate for the lower concentration repulsive regions, shown as lightly shaded region 36 in the figure, the latter is initially formed over the entire area of the charge transfer region excluding the areas under electrodes, such as 37, where mobile carriers are actually stored. This may be preferable to the embodiment of FIG. 2 where the corresponding regions 28 are limited to the area under electrodes, since critical alignment problems are reduced. Also, in order to ensure that during transfer no charge can diffuse to an adjacent electrode of the same conductive strip, small strips of channel stopping regions, in this case p++ type, are provided in the medium across each narrow portion of the conductive strips. These regions are illustrated as heavily shaded regions such as 38 to indicate that they are more heavily doped than the region 36 which is utilized to determine directionality during charge transfer.

It will also be clear to those skilled in the art that the invention is not limited to the three-phase addressing scheme described above. Any number of phases greater than three could also provide the proper pulsing sequence for moving the mobile carriers in two noncollinear directions with the inventive principles described herein.

Finally, it will be recognized that the principles described herein are applicable to the "buried-channel" type of charge coupled device which is by now well known in the art, having been originally described and claimed in U.S. patent application of W. S. Boyle and G. E. Smith, Ser. No. 131,722, filed Apr. 6, 1971. In such devices, storage and transfer of mobile charge carriers are made to take place inside the bulk of the storage medium rather than at the storage medium-insulator interface. In adapting the present inventive principles for such devices, any localized surface regions of fixed charge would simply be formed to a depth sufficient to produce the same effect on the buried channel as was taught for the surface channel devices.

Various additional modifications and extensions will become apparent to those skilled in the art. All such deviations which basically rely on the teachings through which the invention has advanced the art are properly considered within the spirit and scope of the invention.

What is claimed is:

1. A charge transfer device comprising a semiconductor medium which is of a first conductivity type, an insulating layer covering at least a portion of the surface of said medium, a conductive pattern disposed upon said insulating layer comprising a series of conductive strips each formed in the shape of substantially quadrilateral members overlapping in their diagonal dimension placed such that the members form a two-dimensional array of rows and columns of electrodes with each electrode being coupled along a diagonal dimension in common with all other electrodes in said diagonal dimension to one of a plurality of conduction paths extending over said insulating layer to which a suitable bias may be applied, and means included under a portion of each electrode for forming under each electrode an asymmetric potential well when a suitable bias is applied to said conduction paths, said electrodes being positioned with respect to said means for forming an asymmetric potential well so that said means extends under an area of each electrode bounding two adjacent sides of said electrode so as to define a plurality of parallel transfer paths in said medium in each of two noncollinear directions of movement of mobile charge carriers in a plane essentially parallel to said one surface of said medium, wherein the transfer paths in one direction are formed under the rows of said electrodes and the transfer paths in the other direction are formed under the columns of said electrodes and wherein for any electrode, an adjacent electrode in the row and an adjacent electrode in the column are coupled to different ones of said conduction paths.

2. The device according to claim 1 wherein the means for establishing an asymmetric potential well under each electrode comprises localized surface regions of fixed charge of suitable conductivity type formed in said medium included in an area below each electrode.

3. The device according to claim 2 wherein the means for establishing an asymmetric potential well comprises a region of fixed charge of the same conductivity type as the medium but higher impurity concentration included in an area in the medium under a limited portion of each electrode so as to form beneath each electrode an angular region bounding two adjacent sides of said electrode while leaving a substantially quadrilateral area of the medium impurity concentration beneath each electrode.

4. The device according to claim 2 wherein the means for establishing an asymmetric potential well comprises a region of fixed charge of a conductivity type opposite to the medium included in an area of the medium under a limited portion of each electrode so as to form beneath each electrode a substantially quadrilateral region bounding a portion of two adjacent sides of each electrode.

5. The device according to claim 1 further comprising regions of fixed charge of a conductivity type opposite to said medium included in the areas of the medium in the gaps between said electrodes in each noncollinear transfer path.

6. The device according to claim 1 wherein the number of conduction paths is three.

7. The device according to claim 1 further comprising means for sequentially biasing said conduction paths in order to transfer carriers in either of said noncollinear transfer paths.

* * * * *